United States Patent [19]

Tustaniwskyj et al.

[11] Patent Number: 4,809,134
[45] Date of Patent: Feb. 28, 1989

[54] LOW STRESS LIQUID COOLING ASSEMBLY

[75] Inventors: Jerry I. Tustaniwskyj, Mission Viejo, Calif.; James H. Rogneby, Bloomington, Minn.

[73] Assignee: Unisys Corporation, Blue Bell, Pa.

[21] Appl. No.: 182,393

[22] Filed: Apr. 18, 1988

[51] Int. Cl.⁴ .......................... H02B 1/00; H05K 7/20
[52] U.S. Cl. .................................... 361/385
[58] Field of Search ........................ 361/385; 357/82; 165/80.2, 80.4, 80.5, 86, 67

[56] References Cited

U.S. PATENT DOCUMENTS

| | | | |
|---|---|---|---|
| 4,226,281 | 10/1980 | Chu | 165/80.2 |
| 4,381,032 | 4/1983 | Cutchaw | 361/385 |
| 4,649,990 | 3/1987 | Kurihara et al. | 165/80.4 |

*Primary Examiner*—Roy N. Envall, Jr.
*Attorney, Agent, or Firm*—Charles J. Fassbender; Kenneth L. Miller

[57] ABSTRACT

A liquid cooled electronic circuit includes a printed circuit board having two oppositely facing surfaces, electronic components mounted on one of the two surfaces, and conduits which carry a liquid and touch the electronic components to cool them; wherein a frame is also provided for holding the conduits snugly against the components without overstressing the printed circuit board. This frame is characterized as having: (a) a first set of contacts which engage the conduits; (b) a second set of contacts which engage the surface of the printed circuit board opposite the one surface; (c) the contacts of the second set being spaced apart and located at predetermined distances from the board's perimeter; and (d) fasteners for urging the conduits against the electronic components by moving the first and second sets of contacts toward each other with the conduits, the electronic components, and the printed circuit board lying therebetween.

12 Claims, 5 Drawing Sheets

Fig. 3b
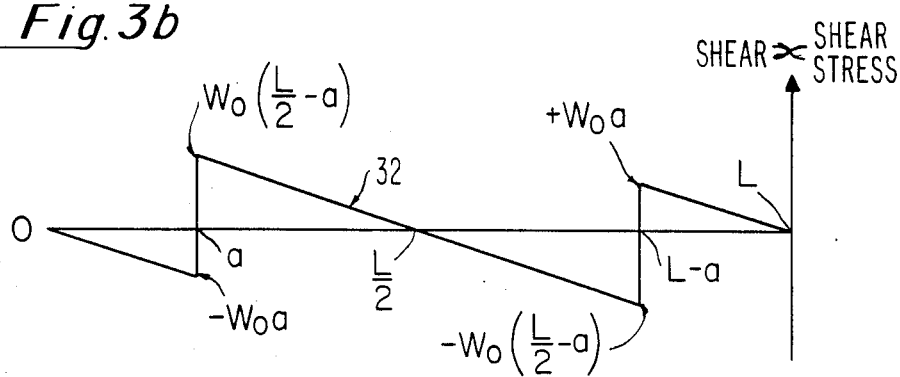
Fig. 3c
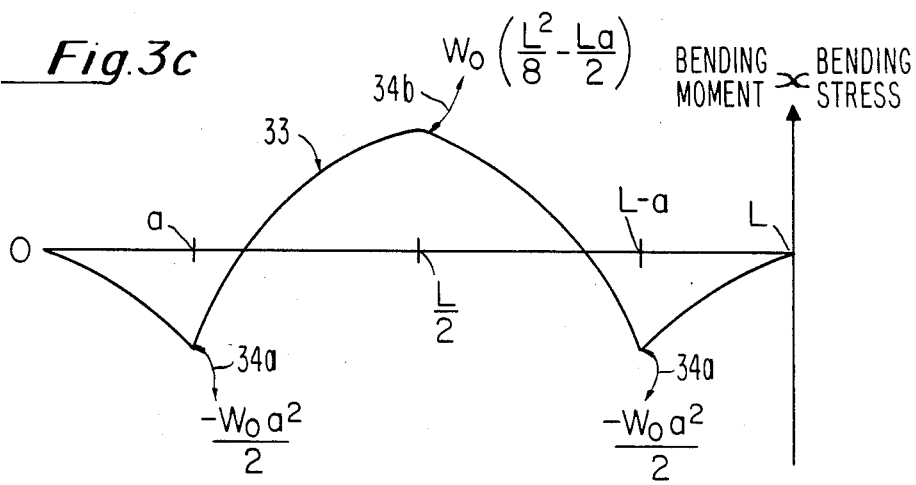
Fig. 3d
eq.1 ～ $\dfrac{W_0 a^2}{2} = W_0 \left(\dfrac{L^2}{8} - \dfrac{La}{2}\right)$
eq.2 ～ $a = \dfrac{L}{2}\sqrt{2} - 1 = 0.207L \approx 0.2L$
eq.3 ～ $M = \dfrac{W_0}{2}(0.2071L)^2$
eq.4 ～ $M_0 = W_0 \left(\dfrac{L^2}{8}\right)$
eq.5 ～ $\dfrac{M}{M_0} = 0.1716$

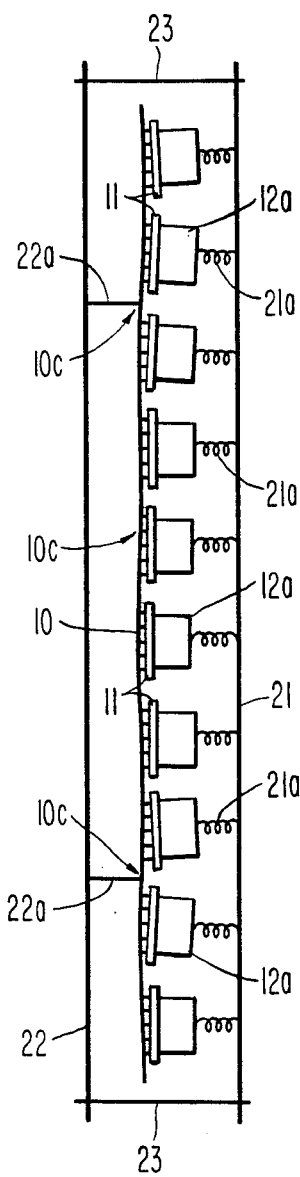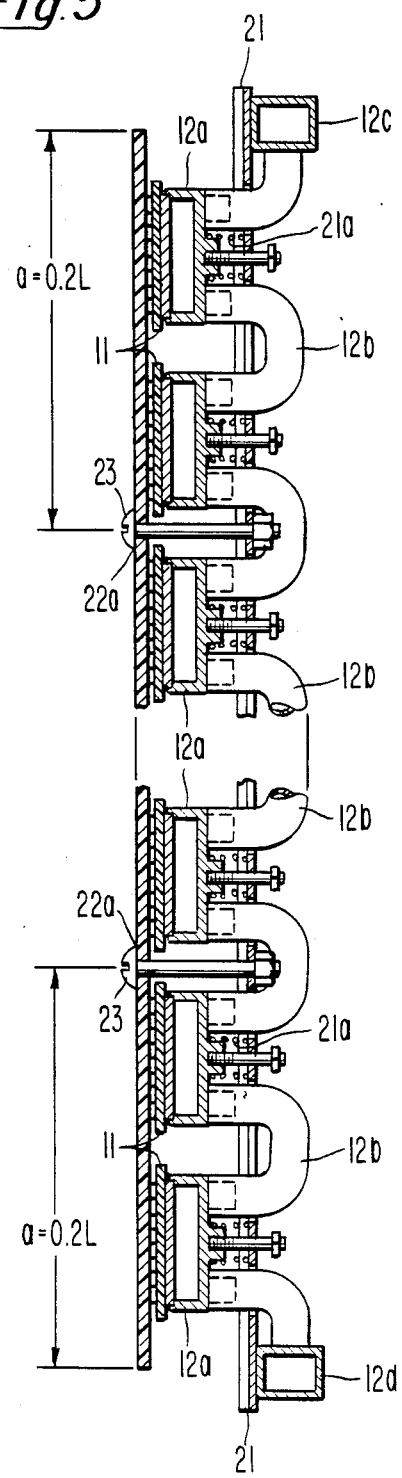

4,809,134

LOW STRESS LIQUID COOLING ASSEMBLY

BACKGROUND OF THE INVENTION

This invention relates to mechanisms for cooling electrical components; and more particularly, it relates to mechanisms for liquid-cooling integrated circuit packages on a printed circuit board without overstressing the board.

In the prior art, integrated circuit packages have been liquid-cooled by providing a plurality of cooling jackets which respectively contact the integrated circuit packages. A liquid coolant passes through the cooling jackets to carry heat away from the integrated circuit packages by conduction. Fluid is supplied to the cooling jackets by means of an input manifold, and fluid is taken from the cooling jackets by means of an output manifold. One such liquid cooling mechanism is shown and described in patent application Ser. No. 108,367 which is entitled "Self-Aligning Liquid-Cooling Assembly".

A problem, however, which the above referenced liquid-cooling mechanism does not address is how to reduce and minimize mechanical stresses in the printed circuit board. Those stresses, as the present application shows, will occur due to certain forces which the cooling jackets exert on the integrated circuit packages. If these stresses are not properly managed and become too large, the printed circuit board can bend to a point where malfunctions start to occur. Specifically, conductors on the board which interconnect the integrated circuit package can break. Also, the thermal conduction that occurs between an integrated circuit package and its cooling jacket can be degraded, causing the integrated circuit packages to heat up and not operate properly.

Accordingly, a primary object of the invention is to provide an improved mechanism for cooling integrated circuit packages on a printed circuit board in which mechanical stress and deflection in the board is greatly reduced.

BRIEF SUMMARY OF THE INVENTION

With the present invention, an electromechanical assembly is formed which includes (1) a printed circuit board having two oppositely facing major surfaces, (2) integrated circuit packages mounted on one of the two surfaces, and (3) conduits which carry a liquid and touch the integrated circuit packages to cool them. Also, this assembly includes a frame for holding the conduits snugly against the integrated circuit packages without overstressing the printed circuit board. This frame is characterized as having: (a) a first set of contacts which engage the conduits; (b) a second set of contacts which engage the surface of the printed circuit board opposite the one surface; (c) the contacts of the second set being spaced apart and located at predetermined distances from the board's perimeter; and, (d) fasteners for urging the conduits against the integrated circuit packages by moving the first and second sets of contacts toward each other with the conduits, the integrated circuit packages, and the printed circuit board lying therebetween.

BRIEF DESCRIPTION OF THE DRAWINGS

Various features and advantages of the invention are described herein in accordance with the accompanying drawings wherein:

FIGS. 3A–3D show a physical analysis of the various forces and stresses which are acting upon the FIG. 1 embodiment;

FIG. 4 is a schematic diagram of the FIG. 1 embodiment which shows how it operates under the condition where the printed circuit board is warped;

FIG. 5 shows the physical details of another preferred embodiment of the invention.

DETAILED DESCRIPTION OF THE INVENTION

Figure 1:
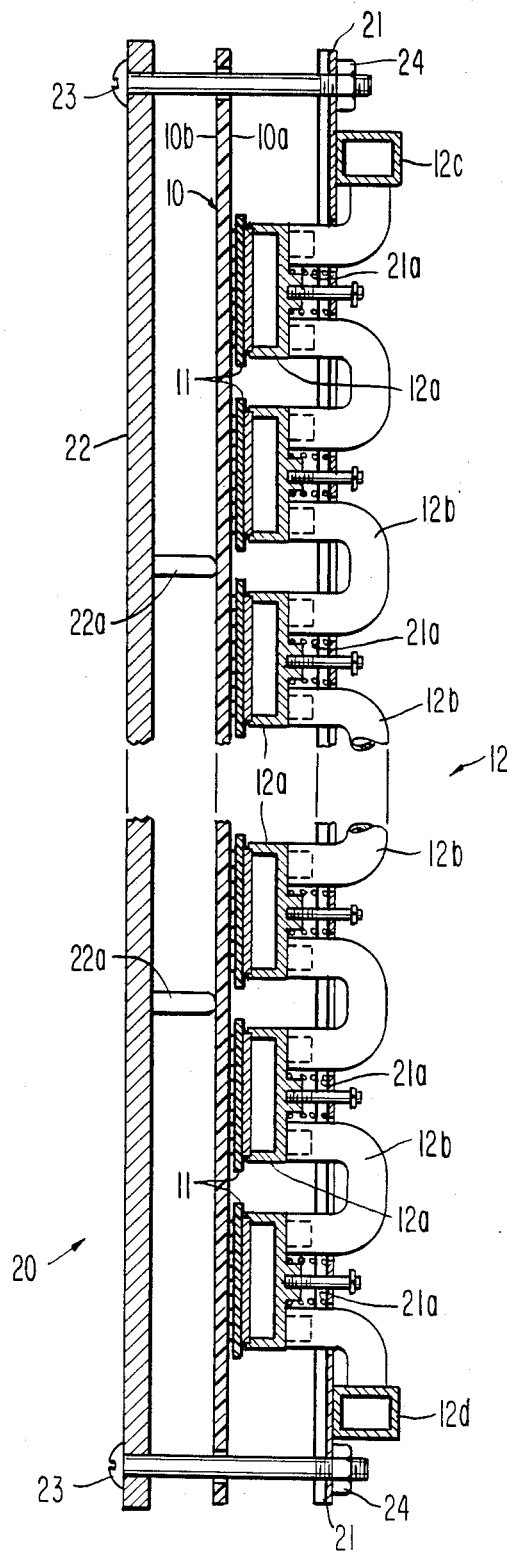
FIG. 1 shows the structural details of one preferred embodiment of the invention.

Referring now to FIG. 1, a preferred embodiment of the invention will be described in detail. In FIG. 1, reference numeral 10 indicates a printed circuit board which has two major surfaces 10a and 10b. Electrical components, such as integrated circuit packages 11, are mounted on surface 10a. Those packages dissipate heat when they operate. So to cool the packages 11, a conduit 12 is provided which includes components 12a–12d. Each of the components 12a is a cooling jacket which contacts a respective integrated circuit package 11 to cool it. A liquid coolant is routed through the cooling jackets 12a by means of an input manifold 12b, a plurality of hoses 12c, and an output manifold 12d. FIG. 1 shows only one column of packages 11 and cooling jackets 12a, but other identical parallel columns are disposed over almost the entire surface 10a.

Now in accordance with the invention, the FIG. 1 assembly also includes a frame 20 which is made of all of the components that are numbered in the twenties (i.e., components 21, 21a, 22, 22a, 23, 24). This frame operates to hold the cooling jackets 12a snugly against the integrated circuit packages 11 without overstressing the printed circuit board 10. Components 21 and 22 are a pair of beams. Beam 21 has a set of helical spring contacts 21a which engage each of the cooling jackets 12a; and beam 22 has another set of cylindrical contacts 22a which project towards the printed circuit board and engage its surface 10b at spaced apart locations which are predetermined distances from the board's perimeter. Frame 20 also includes some bolts 23 which pass through the ends of the beams 21 and 22. Respective nuts 24 are tightened on the bolts to move the contacts 21a and 22a towards each other. This movement, in turn, squeezes together the cooling jackets 12a the integrated circuit packages 11, and the printed circuit board 10.

Figure 2:
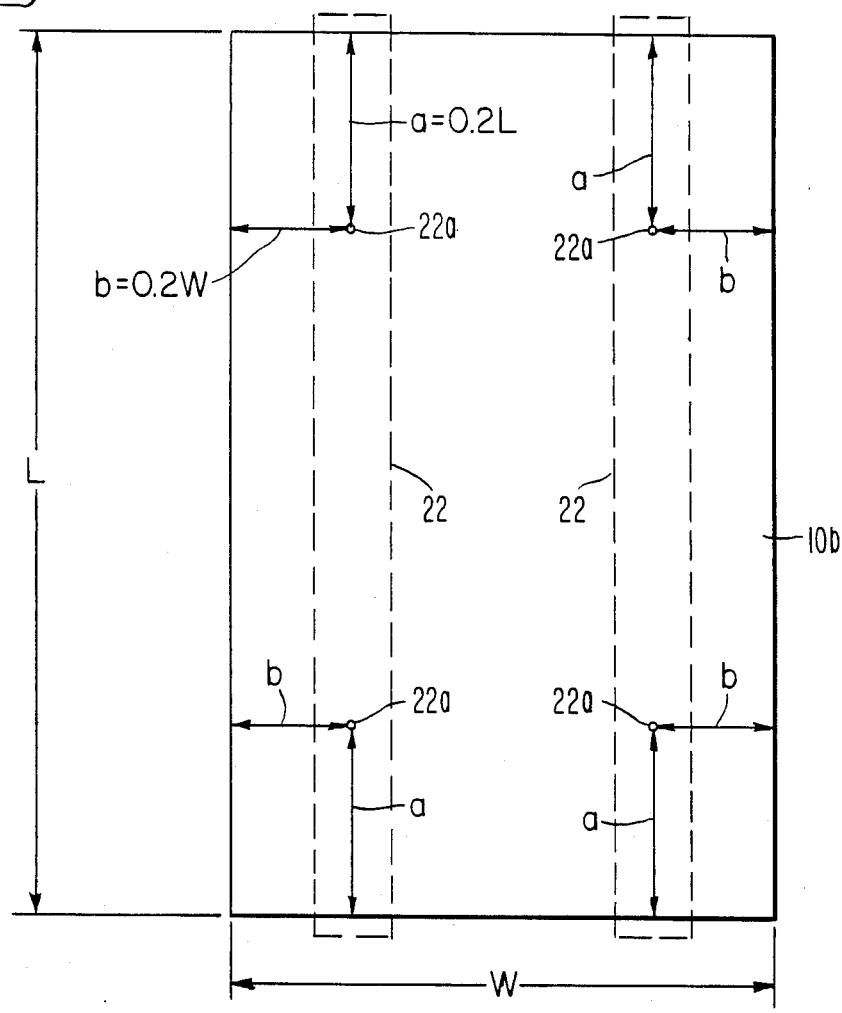
FIG. 2 shows another view of the FIG. 1 embodiment which illustrates the placement of that embodiment's contacts.

Considering now FIG. 2, it shows in greater detail one preferred configuration and placement of the contacts 22a on surface 10b of the printed circuit board. In FIG. 2, there are a total of four contacts 22a. Two of the contacts 22a on the left half of surface 10b are provided by one beam 22; and the remaining two contacts on the right half of surface 10b are provided by another beam 22. These contacts 22a are located at distances of approximately 0.2 L and 0.2W from the perimeter of the board where L and W respectively are length and width of the board. Such a contact configuration has the effect of greatly reducing stress in the board 10 as will be described now in conjunction with FIGS. 3A–3D.

Figure 3A:
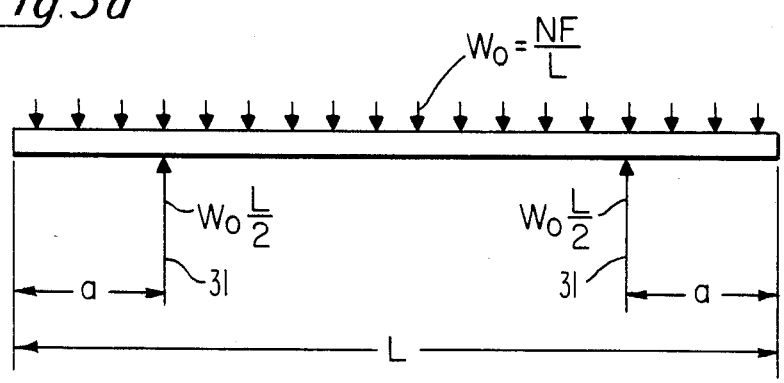

FIG. 3A shows the forces which act on the left half and the right half of board 10. Both halves of the board 10 are identically loaded, and so the analysis of each half of the board is the same. A distributed force $W_0$ is exerted on surface 10a since the contacts 21a of beam 21 squeeze the cooling jackets 12a and the integrated circuit packages 11 against essentially that entire surface. This distributed force $W_0$ has a per unit length magnitude of (NF)/L where N is half the number of cooling jackets on the printed circuit board, and F is the force that a single contact 21a exerts against a single cooling jacket. Two concentrated forces 31 on surface 10b counterbalance the distributed force on surface 10a. Those forces 31 are exerted by two of the contacts 22a, and they each have a magnitude of $(W_0L)/2$.

Considering now FIG. 3B, it contains a curve 32 which is the integral of the loading in FIG. 3A taken along the length of the board. This integral at any point along the length is proportional to the shear stress that exists in the printed circuit board 10 at that same point. Another curve 33 in FIG. 3C is the integral of curve 32 taken along the board='s length. Curve 33 is important since its magnitude at any point is proportional to the bending stress in the printed circuit board 10 at that same point.

Curve 33 has three peaks which occur at the distances of "a", "L/2", "L-a". Those peaks have magnitudes which are indicated by terms 34a and 34b. Inspection of the terms 34a and 34b shows that as the distance "a" decreases, term 34a gets smaller and term 34b gets bigger. Conversely, as distance "a" increases, term 34a gets bigger and term 34b gets smaller.

To minimize peak bending stress in the printed circuit board 10, terms 34a and 34b should be made equal in magnitude to each other. This equality is stated by Equation 1 in FIG. 3D. Solving Equation 1 for the distance "a" yields Equation 2. Thus, as Equation 2 states, peak bending stress will be minimized in board 10 when the distance "a" is made equal to approximately 0.2L. A similar analysis can be made on a cross section of board 10 which is taken along the board's width W; and, the result of that analysis is that the distance "b" should be equal to 0.2W.

Substituting the result of Equation 2 into term 34a yields Equation 3. In that equation, the term "M" is proportional to the maximum bending stress which will occur in the printed circuit board 10 when the constraint of a=0.2L is met. By comparison, letting "a" equal zero in term 34b provides an expression for the maximum bending stress that occurs in the printed circuit board 10 under the condition where beam 22 and its contacts 22a are eliminated, and the conduits 12c and 12d are bolted to the edge of the board. Letting "a" equal zero in term 34b yields Equation 4. Then, dividing Equation 3 by Equation 4 yields Equation 5 which says that the peak bending stress in board 10 when Equation 2 is met is only 17% of the peak bending stress in board 10 when the conduit is supported at the board's perimeter.

Besides producing stress in the printed circuit board 10, the forces which act on it also deflect the board. But with the structure of frame 20 as given in FIG. 1, those deflections are substantially reduced over that which would occur if beam 22 were eliminated and the conduits 12c and 12d were bolted onto the perimeter of the board. To illustrate this point, deflection was calculated from curve 33 of FIG. 3C. Deflection is proportional to the double integral of curve 33 along the length, and this calculation was performed via a computer. Table 1 below gives the result of this calculation.

TABLE 1

| X/L | Normalized Deflection With Invention | Normalized Deflection Without Invention |
| --- | --- | --- |
| 0.00000 | 0.00020 | 0.00000 |
| 0.05000 | 0.00017 | −0.00207 |
| 0.10000 | 0.00014 | −0.00409 |
| 0.15000 | 0.00009 | −0.00599 |
| 0.20000 | 0.00001 | −0.00773 |
| 0.25000 | −0.00011 | −0.00923 |
| 0.30000 | −0.00025 | −0.01059 |
| 0.35000 | −0.00039 | −0.01164 |
| 0.40000 | −0.00051 | −0.01240 |
| 0.45000 | −0.00059 | −0.01286 |
| 0.50000 | −0.00061 | −0.01302 |
| 0.55000 | −0.00059 | −0.01286 |
| 0.60000 | −0.00051 | −0.01240 |
| 0.65000 | −0.00059 | −0.01164 |
| 0.70000 | −0.00025 | −0.01059 |
| 0.75000 | −0.00011 | −0.00928 |
| 0.80000 | 0.00001 | −0.00773 |
| 0.85000 | 0.00009 | −0.00599 |
| 0.90000 | 0.00014 | −0.00409 |
| 0.95000 | 0.00017 | −0.00207 |
| 1.00000 | 0.00020 | −0.00000 |

In Table 1, the leftmost column defines an arbitrary point "X" along the length of board 10 as a ratio of X to L. Normalized deflection in board 10 at the point X is given by the middle column for the condition where frame 20 is employed to support the board and the contacts 22a are positioned as shown in FIG. 2. For comparison, the rightmost column of Table 1 gives the normalized deflection at point X under the conditions where beam 22 and its contacts 22a are eliminated, and the bolts 23a and 23b connect directly to the perimeter of the board. Note, normalized deflection can be converted to actual deflection by multiplying it by $(W_0L^4)/EI$ where "E" is the flexural modulus of the material from which board 10 is made and "I" is the area moment of inertia of board 10.

Comparing the center column with the rightmost column shows that the peak deflection in board 10 is reduced with the invention by a factor of more than twenty. This is important because as deflection in board 10 increases, the spring contacts 21a must become lengthened. And, such lengthening will lower the compressive force between a cooling jacket and its integrated circuit chip, which in turn will impede the heat transfer between them.

Another significant feature which results from the FIG. 1 structure is illustrated in FIG. 4. There, the FIG. 1 members are illustrated schematically, and board 10 is shown as having warps 10c. This figure shows that frame 20 will produce essentially the same stress in board 10 regardless of whether that board is warped or flat. Board warpage will not affect stress when frame 20 is used because the contacts 22a hold beam 22 away from the board surface 10b. Without such spacing, beam 22 would rest directly on surface 10b; and thus beam 22 would tend to flatten out any warps in surface 10b. But flattening out a warp in surface 10b produces stress in the board, and the magnitude of the stress would be proportional to the inverse of the radius of curvature of the warp that is flattened. To ensure that no such flattening occurs under the contacts 22a, the area of engagement for each contact preferably is less than 0.25 in$^2$.

One preferred embodiment of the invention has now been described in detail. In addition, however, many changes and modifications can be made to this embodiment without departing from the nature and spirit of the invention. For example, a modified embodiment is shown in FIG. 5. There, beam 22 is eliminated; holes are placed in board 10 at the distances of 0.2L and 0.2W from the board's perimeter; and the bolts 23 pass through those holes and attach to beam 21. Thus the heads of the bolts act as the contacts 22a. This embodiment has the same force diagrams as FIGS. 3A–3D; and consequently, it has the same stress reduction features. Also, stress in the FIG. 5 embodiment is independent of board warpage. However, the holes for the bolts in the FIG. 5 embodiment do take up a certain amount of board space.

Figure 6:
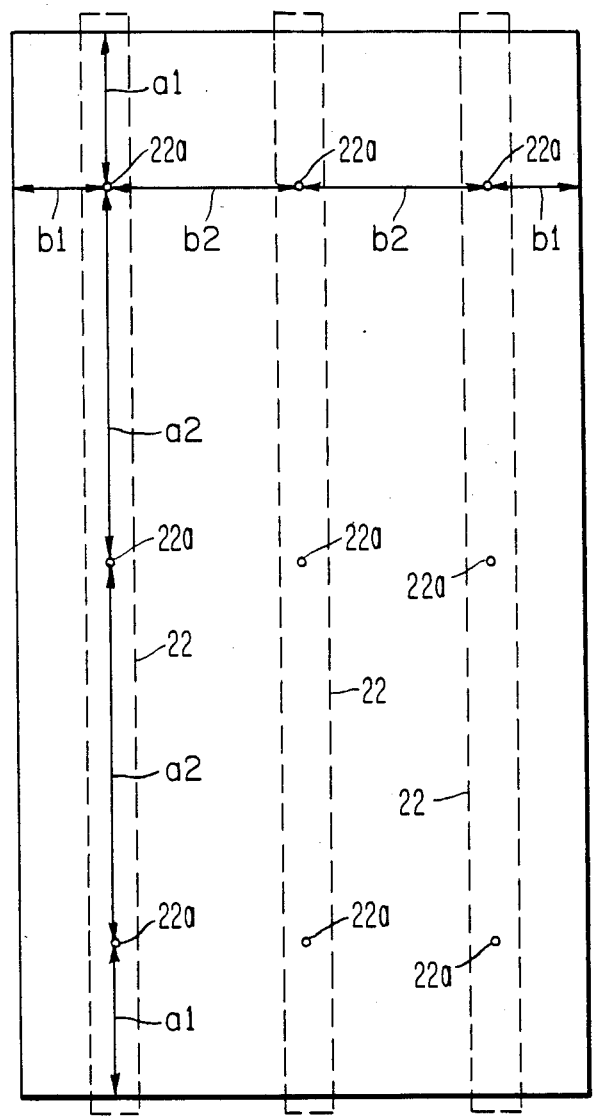
FIG. 6 shows the details of still another preferred embodiment of the invention.

As still another modification to the above described embodiments, the total number of contacts 22a can be increased. Preferably, the total number of contacts 22a ranges from four to twenty-five. Increasing the number of contacts lowers the peak bending stress that occurs in board 10, but it also adds material and thus increases cost. FIG. 6 shows an embodiment which has three beams 22, with each beam having three contacts 22a—giving a total of nine contacts 22a. In FIG. 6, the distance a1 is 2/14L, the distance a2 is 5/14L; the distance b1 is 2.5/15W; and the distance b2 is 5/15W. These locations for the nine contacts 22a equalize the magnitudes of the positive and negative bending stress peaks which occur in board 10 at the contacts 22a, as can be shown by an analysis similar to that which was performed in FIGS. 3A–3D.

As yet another modification, the cylindrical shape of the contacts 22a can be changed. For example, they can be semi-spherical shaped, or shaped as a helical spring. Also, the contacts 22a can be made of various materials; but preferably they are made of an elastic material, such as rubber, which is stiffer than the springs 21a. Also, various electrical components, such as resistors or capacitors, can be mounted between the contacts 22a on surface 10b of the printed circuit board.

Accordingly, it is to be understood that the invention is not limited to the above details but is defined by the appended claims.

What is claimed is:

1. An improved liquid cooled electronic circuit assembly of the type which includes a printed circuit board having two oppositely facing major surfaces, electronic components mounted on one of said two surfaces, and conduits which carry a liquid and touch said electronic components to cool them; wherein the improvement comprises a frame for holding said conduits snugly against said components without overstressing said printed circuit board; said frame being characterized as having: (a) a first set of contacts which engage said conduits; (b) a second set of contacts which engage the surface of said printed circuit board opposite said one surface; (c) said contacts of said second set being spaced apart and located at predetermined distances from the board's perimeter; and, (d) a means for urging said conduits against said electronic components by moving said first and second sets of contacts toward each other with said conduits, said electronic components, and said printed circuit board lying therebetween.

2. An assembly according to claim 1 wherein said frame includes: a first beam which has contacts of said first set that engage said conduits, a second beam which has contacts of said second set that engage the surface of said printed circuit board opposite said one surface, and fasteners which join and move said first and second beams toward each other.

3. An assembly according to claim 1 wherein said frame includes: a beam which has contacts of said first set that engage said conduits, and fasteners which couple to said first beam and penetrate said board at predetermined locations to there form said second set of contacts.

4. An assembly according to claim 1 wherein said contact of said second set are spaced in a pattern which equalizes the peak amplitudes of the positive and negative bending stress in said board.

5. An assembly according to claim 1 wherein a total of four contacts are in said second set, and said four contacts are located at distances of approximately 0.2L and 0.2W from the perimeter of said board where L and W respectively are the length and width of the board.

6. An assembly according to claim 1 wherein a total of nine contacts are in said second set, and said nine contacts are located at distances of approximately (2/14)L, (7/14)L, (2.5/15)W, and (7.5/15)W from the perimeter of said board where L and W respectively are the length and width of the board.

7. An assembly according to claim 1 wherein each contact of said second set touches an area of less than 0.25 square inches on said board.

8. An assembly according to claim 1 wherein said second set of contacts consists of from four to twenty-five contacts.

9. An assembly according to claim 1 wherein said contacts of said second set are cylindrical members.

10. An assembly according to claim 1 wherein said contacts of said second set are helical springs.

11. An assembly according to claim 1 wherein said contacts of said first and second sets are made of an elastic material, with said contacts of said second set being stiffer than the contacts of said first set.

12. A mechanism for holding cooling members snugly against electronic components on one surface of a printed circuit board without overstressing the board; said mechanism being characterized as having: (a) a first set of contacts which engage said cooling members; (b) a second set of contacts which engage a surface of said printed circuit board opposite said one surface; (c) said contacts of said second set being spaced apart and located at predetermined distances from the board's perimeter; and, (d) a means for urging said cooling members against said electronic components by moving said first and second sets of contacts toward each other with said cooling members, said electronic components, and said printed circuit board lying therebetween.

* * * * *